United States Patent
Arai et al.

(10) Patent No.: US 6,569,239 B2
(45) Date of Patent: May 27, 2003

(54) SILICON EPITAXIAL WAFER AND PRODUCTION METHOD THEREFOR

(75) Inventors: Takeshi Arai, Annaka (JP); Tadaaki Honma, Annaka (JP); Hitoshi Habuka, Annaka (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 09/901,100

(22) Filed: Jul. 10, 2001

(65) Prior Publication Data

US 2001/0039917 A1 Nov. 15, 2001

Related U.S. Application Data

(62) Division of application No. 09/359,803, filed on Jul. 26, 1999, now abandoned.

(30) Foreign Application Priority Data

Jul. 29, 1998 (JP) .......................................... 10-228665

(51) Int. Cl.[7] ............................................. C30B 25/10
(52) U.S. Cl. ...................................................... 117/89
(58) Field of Search ................................ 117/84, 88, 89

(56) References Cited

U.S. PATENT DOCUMENTS

| | | | | |
|---|---|---|---|---|
| 3,971,956 A | * | 7/1976 | Jakeman et al. | 250/571 |
| 5,508,800 A | * | 4/1996 | Miyashita et al. | 356/30 |
| 5,510,894 A | * | 4/1996 | Batchelder et al. | 356/301 |
| 5,705,423 A | * | 1/1998 | Sakata et al. | 437/81 |
| 5,718,762 A | * | 2/1998 | Habuka et al. | 117/97 |
| 5,869,387 A | * | 2/1999 | Sato et al. | 438/459 |
| 5,904,769 A | * | 5/1999 | Ohashi et al. | 117/89 |

OTHER PUBLICATIONS

Wolf et al., Silicon Processing for the VLSI Era vol. 1: Process Technology, Lattice Press, Sunset Beach, CA, USA, pp. 23–30, 124–153.*

* cited by examiner

*Primary Examiner*—Benjamin L. Utech
*Assistant Examiner*—Matthew A. Anderson
(74) *Attorney, Agent, or Firm*—Snider & Associates; Ronald R. Snider

(57) ABSTRACT

A surface roughness distribution in the surface of a silicon epitaxial wafer is made uniform by optimizing a temperature distribution in the surface of a susceptor used in a vapor phase thin film growth apparatus. The susceptor is not supported by its center of the rear surface thereof, but only the peripheral portion thereof is supported using vertical pins respectively provided at the far ends of spokes radially branched from a rotary shaft. The susceptor is constituted so that a difference in temperature between the maximum and minimum in the surface of a silicon wafer is suppressed to a value equal to or less than 7° C. Hence, a surface roughness distribution in the surface of the silicon epitaxial wafer can be suppressed to a value equal to or less than 0.02 ppm.

8 Claims, 11 Drawing Sheets

F I G. 1
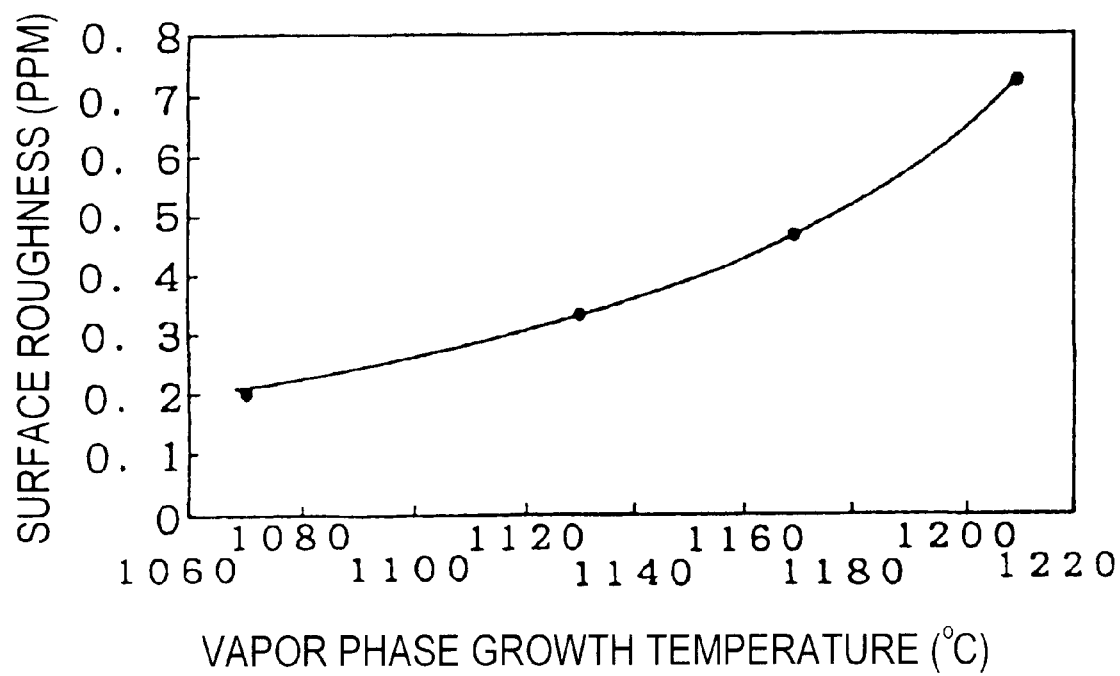

SILICON EPITAXIAL WAFER AND PRODUCTION METHOD THEREFOR

This application is a divisional of U.S. patent application 09/359,803, filed Jul. 26, 1999, now abandoned.

RELATED APPLICATION

This application claims the priority of Japanese Patent Application No. 10-228665 filed on Jul. 29, 1998, which is incorporated herein by reference.

BACKGROUND OF THE INVENTION

1. Field of the Invention

This invention relates to a silicon epitaxial wafer and a production method therefor and particularly, to high precision control of surface roughness of a silicon epitaxial layer through realization of uniform temperature distribution in a surface of a silicon wafer.

2. Description of the Prior Art

A design rule of a semiconductor device has already been reached to a subquarter micron level in a practical aspect. As an electric charge handled in a semiconductor device is decreased with progress in miniaturization, even a small number of minute defects in the vicinity of a surface of a silicon single crystal substrate have a possibility of giving a fatal influence on device characteristics larger than in the past: deterioration in performances of a bipolar circuit and a CMOS circuit has especially been problematic.

Therefore, it is expected that, hereinafter, a silicon epitaxial wafer produced by growing a silicon epitaxial layer on a silicon single crystal substrate in a vapor phase will increasingly be used instead of the silicon single crystal substrate, which is produced in a process in which a silicon single crystal ingot pulled from a melt is sliced and a slice is mirror-polished. In the following description, a silicon single crystal substrate and a silicon epitaxial wafer are generically called as a silicon wafer.

High level uniformity of thickness distribution is required for a silicon epitaxial wafer. The thickness distribution uniformity may alternatively be expressed by a flatness of a silicon epitaxial layer which is grown on a silicon single crystal substrate since the silicon single crystal substrate is originally high in flatness. The reason why the high level flatness is required is that a wavelength of exposure light which has been used in photolithography in recent years is shorter down to the far-ultra violet region and a depth of focus has greatly been reduced, so that there arises a necessity to earn any amount of a process margin. Such a requirement for high level flatness is strengthened more and more as a diameter of a silicon wafer is increased from a current 200 mm to 300 mm or more.

A structure of a single wafer type vapor phase thin film growth apparatus 20 is shown as an example in FIG. 8. In the apparatus, a silicon wafer W is singly disposed in a process vessel 21 made of transparent quartz and vapor phase growth of a thin film is performed while the silicon wafer W is heated from above and under by radiation of infrared lamps 29a, 29b. The infrared lamps 29a are an outside group and the infrared lamps 29b are an inside group.

The interior of the process vessel 21 is partitioned into an upper space 21a and a lower space 21b by a susceptor 25 on which a silicon wafer is disposed. A raw material gas which is introduced together with $H_2$ gas, a carrier gas, through a gas supply port 22 into the upper space 21a flows in a direction of an arrow A in the figure while forming a near laminar flow along a surface of the silicon wafer W and then discharged from an exhaust port on the other side. A purge gas which is $H_2$ gas under higher pressure than that of the raw material gas is supplied into the lower space 21b. The reason why the purge gas is under the higher pressure is to prevent the raw material gas from flowing into the lower space 21b through a gap between the process vessel 21 and the susceptor 25.

The lower space 21b contains support means made of quartz for supporting the susceptor 25 by the rear surface and lift pins 28 for loading and unloading of a silicon wafer W on the susceptor 25.

The support means is constructed from a rotary shaft 26 and a plurality of spokes 27 which radially branch away from the rotary shaft 26. Vertical pins 27b, 27c are provided to the far end of each spoke 27 and the top end of the rotary shaft 26 and the fore ends of the vertical pins 27b, 27c are respectively engaged in recesses 25c, 25d formed in the rear surface of the susceptor 25 for supporting the susceptor 25. The rotary shaft 26 is rotatable by drive means, not shown, in a direction of an arrow C in the figure.

The head of each of the lift pins 28 is enlarged in diameter and is rested while hanging on a tapered side wall of a through-hole 25b formed in the bottom surface of a pocket 25a of the susceptor 25 for disposing a silicon wafer W therein. The shaft portion of each lift pin 28 is inserted through a through-hole 27a which is formed by boring the middle portion between both ends of a spoke 27 and each lift pin 28 is designed to be vertically hung down in a stable manner.

A silicon wafer W is loaded on and unloaded from the susceptor 25 by vertical movement of the support means. For example, when the silicon wafer W is unloaded from the susceptor 25, the support means is moved downward and the tail ends of the lift pins 28 are directly put into contact with the inner surface of the lower space 21b of the process vessel 21 as shown in FIG. 9. With such encouraged conditions, the lift pins 28 push up the rear surface of the silicon wafer W with the heads, thereby floating the silicon wafer W upward from the pocket 25a. Thereafter, a handler, not shown, is inserted in a space between the susceptor 25 and the silicon wafer W and the silicon wafer W is handed over or received and further transported.

A susceptor 25 is usually made from graphite base material coated with a thin film of SiC (silicon carbide). The reason why graphite is chosen as base material is that though it is related with the fact that heating for vapor phase thin film growth apparatuses in the early stage in development was mainly conducted by high frequency induction heating, in addition graphite has merits such as a high purity product being easy to be obtained, being easy to be machined, a thermal conductivity being excellent, being hard to be broken and the like. However, graphite is a porous material mass and therefore has problems such as there being a possibility to release occluded gas during process, the surface of a susceptor being changed into SiC through a reaction between graphite and a raw material gas in the course of vapor phase thin film growth and the like. From such reasons, it is generalized that the surface of graphite is covered by a SiC film before use. A SiC thin film is usually formed by CVD (a chemical vapor deposition method).

A material of the lift pins 28 is also graphite as base material coated with SiC as in the case of the susceptor 25.

While a requirement for a flatness of a silicon epitaxial wafer has increasingly been severer every year, there has been found that even with a single wafer vapor phase thin film growth apparatus having a structure mentioned above, whose structural materials are improved, differences in thickness between positions in the surface of an epitaxial layer are not avoided according to a specific area in the surface. Especially when a thickness of a silicon epitaxial layer exceeds about 8 μm, there is a trend that differences in thickness between positions in the surface of a silicon epitaxial layer are increased to a level which is unfavorable for practical use.

A film thickness distribution of a silicon epitaxial layer observed by the inventors is shown in FIGS. 10A to 10C, wherein the silicon epitaxial layer with p type conductivity and a resistivity of 10 Ω·cm was grown on a $p^+$ type silicon single crystal substrate with a diameter of 200 mm, a main surface of a (100) plane and a resistivity of 0.01 Ω·cm to 0.02 Ω·cm to a target thickness 15 μm. FIG. 10A shows a measurement direction for a thickness distribution; a direction which faces to a notch N which show a crystallographic orientation is called a vertical direction and a direction which intersects perpendicularly to the vertical direction is called a lateral direction. FIG. 10B is a film thickness distribution vs. a distance in the lateral direction from the center of a silicon epitaxial wafer EW. FIG. 10C shows a film thickness distribution vs. a distance in the vertical direction from the center of a silicon epitaxial wafer EW.

As can be clear from the figures, there is a trend that thickness of a silicon epitaxial layer is decreased at the center.

Since flatness is extremely large to be about 0.3 μm in SFQD (SEMI M1-96) according to the definition by SEMI (Semiconductor Equipment and Materials International) thanks to the decrease in thickness, a flatness-related failure rate sometimes exceeds 4% in production of silicon epitaxial wafers. The SFQD according to the definition by SEMI is, when the entire surface of a wafer is segmented into cells each of 20 mm square, an absolute value of the maximum difference in height between a reference plane which has been obtained by the best fit method and a peak or a valley which occurs in each cell.

It was newly found by the inventors that a similar trend was also observed in FIG. 11 showing a result of measurement with a laser scattered light detection apparatus of a surface roughness distribution in the surface of the silicon epitaxial layer.

A laser scattered light detection apparatus is an apparatus by which magnitudes of a particulate and surface roughness are detected through measurement of an intensity of scattered light which is obtained in scanning on a silicone wafer with laser light. An intensity of scattered light is expressed in a unit of ppm. For example, 0.5 ppm shows that scattered light with an intensity of 0.5 part of incident light 1,000,000 parts is measured. Since an intensity of scattered light is proportional to surface roughness, it is understood that when an intensity of scattered light is larger, convexity and concavity are relatively larger in height and depth.

A laser scattered light detection apparatus can measure on the entire main surface of a silicon wafer, but since irregular reflection from a chamfered portion at a level which cannot be neglected is concurrently measured in the peripheral area of the silicon wafer, measurement values which are obtained in the peripheral area of about several mm in width are usually excluded.

In FIG. 11, the surface of a silicon epitaxial wafer EW can be categorized into 4 regions A to D according to magnitudes of surface roughness in a broad sense. The A region occupies three arc-like parts in the peripheral portion of the wafer and the arc-like parts are almost equal in shape and area; and the B region comprises insular parts located inside disconnections of the A region as centers, wherein the regions A and B have scattered light intensities as large as 0.345 ppm to 0.365 ppm, and it is understood therefore that there occurs relatively large surface roughness in the regions. On the other hand, the C region occurs in a circular shape in the central portion of the wafer; and the D region occurs in dots in the vicinity of the disconnections of the A region, wherein the regions C and D have scattered light intensities as small as 0.330 ppm to 0.335 ppm, and it is understood that there occurs relatively small surface roughness in the regions.

Values of surface roughness in the surface of a silicon epitaxial wafer EW are understood to have a dispersion of 0.035 ppm in terms of a scattered light intensity from a difference between the maximum (0.365 ppm) and the minimum (0.330 ppm) in scattered light intensity.

As mentioned above, in FIG. 11, as well, which shows a distribution of surface roughness of a silicon epitaxial wafer EW, there is observed a trend in which surface roughness is smaller in the center of the silicon epitaxial wafer as in the case of FIGS. 10 B, C.

However, a change in film thickness cannot directly be estimated from surface roughness. The reason why is that surface roughness is mainly dependent on a temperature distribution in the surface of a silicon wafer, whereas a change in film thickness is affected by not only a temperature distribution in the surface of a silicon wafer, but a supply distribution of a raw material gas on the surface.

In any case, when application of a design rule equal to or less than 0.13 μm to a semiconductor process in the future is imagined, the above mentioned thickness distribution cannot be accepted in a practical aspect.

SUMMARY OF THE INVENTION

It is accordingly an object of the invention to provide a silicon epitaxial wafer in which not only uniformity of surface roughness of its silicon epitaxial layer is improved but distributions of flatness and film thickness in its surface are also improved and a production method for the silicon epitaxial wafer.

A silicon epitaxial wafer of the invention has a silicon epitaxial layer whose surface roughness distribution in its surface, which is calculated based on all measurements of surface roughness by a laser scattered light detection method excluding measured values which are respectively included within a cumulative frequency of 0.3% in the upper and lower end sides of all the measurements, is suppressed to be equal to or less than 0.02 ppm.

Exclusion of measurements which are respectively included within a cumulative frequency of 0.3% in the upper and lower end sides is equivalent almost to exclusion of measurements which fall outside the range of x±3σ of all the measurements (x is the average of all the measurements and a is a standard deviation).

The inventors have obtained findings that in production of such a silicon epitaxial wafer, a better result can be realized not only by improving a shape of support means made of quartz to omit the vertical pin 27c located in the central portion but by shifting a contact position of the far end (corresponding to a vertical pin 27b which is described above) of each of support members (corresponding to the spokes 27 which are also above described) with the rear surface of a susceptor further toward the outer periphery thereof compared with conventional and the invention has been proposed based on the findings. At this point, a distance between the outer peripheral edge of the susceptor and a contact position of the far end of each support member therewith is set to a value at which a decrease in temperature of the peripheral portion of a silicon wafer from the maximum temperature in the surface of a silicon wafer is suppressed to be equal to or less than 7° C.

The susceptor is rotated about a rotary shaft and when heating means is a plurality of infrared lamps which are arranged around a central axis, the central axis is shifted eccentric to the rotary shaft of the susceptor, thereby making it possible for radiation heat of the heating means to reach even portions, from under, which have been shielded by support means in the prior art. Therefore, a local decrease in temperature in the surface of the susceptor can be alleviated, thereby making it possible to prevent decrease in film thickness at a position corresponding to the local decrease in temperature of the silicon wafer on the susceptor.

Besides, an influence of the support members can also be alleviated by increasing a distance between the rear surface of the susceptor and the support members compared with the prior art. The distance is set to a value at which a difference in temperature between the maximum and minimum in the surface of the silicon wafer can be suppressed to be equal to or less than 7° C.

As can be clear from the above description, since, in a vapor phase thin film growth apparatus of the invention, improvement on a shape and size of support means is made and a change in relative position of the susceptor to the heating means according to a necessity is effected, a temperature distribution of a susceptor heated by radiation from heating means is optimized, so that not only is uniformity of surface roughness of a silicon epitaxial layer on a silicon wafer disposed on the susceptor improved, but flatness and film thickness distributions in the surface are also improved.

The invention relates to a technique to better a practical performance of a single wafer type vapor phase thin film growth apparatus which is expected to be main stream of its kind in company with a change toward a silicon wafer with a larger diameter and especially, the technique is effective for production of a high quality silicon epitaxial wafer and an industrial value thereof is extremely highly recognized in the semiconductor production field.

BRIEF DESCRIPTION OF THE DRAWINGS

FIG. 1 is a graph showing a relation between surface roughness of a silicon epitaxial layer of a silicon epitaxial wafer and vapor phase growth temperature.

FIG. 3A shows a plan view of the wafer for illustrating measurement directions.

FIG. 10A shows a plan view of the wafer for illustrating measurement directions.

DETAILED DESCRIPTION OF THE PREFERRED EMBODIMENTS

Figure 2:
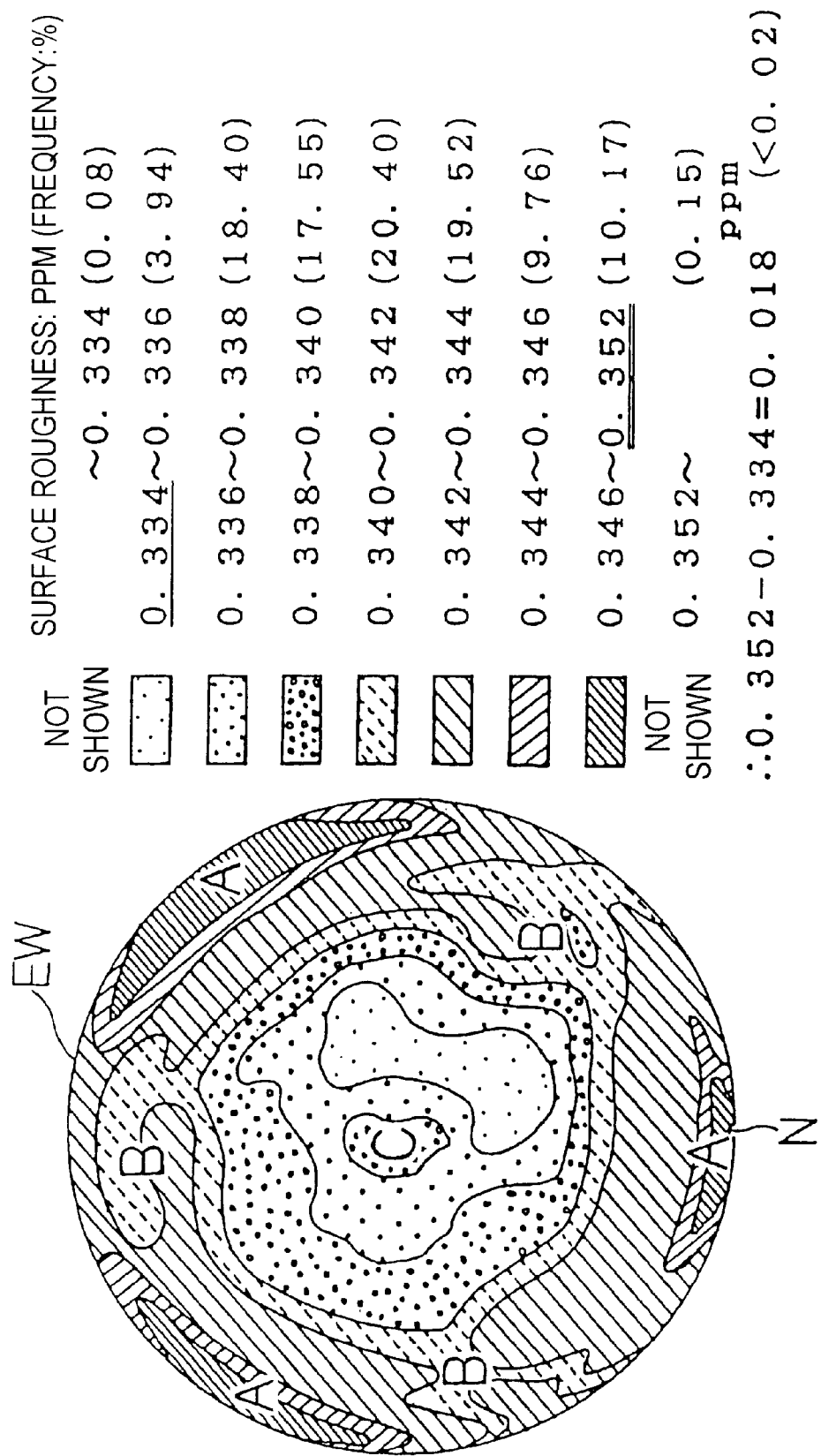
FIG. 2 is a chart showing surface roughness distribution in a silicon epitaxial layer of a silicon epitaxial wafer of the invention.

The invention has been proposed paying attention to the facts that a surface roughness distribution in the surface of a silicon epitaxial layer which is measured using a laser scattered light detection apparatus has a similar trend to a film thickness distribution of a silicon epitaxial layer which is affected by non-uniformity of temperature distribution.

Surface roughness has a correlation with growth temperature and, as shown in FIG. 1, while surface roughness is decreased when growth temperature is lower, surface roughness is increased as growth temperature is raised. That surface roughness is changed by 0.02 ppm in the vicinity of 1130° C. which is commonly used as silicon epitaxial growth temperature means that there is a difference of 7° C. in growth temperature locally. In a diffusion controlled (controlled by feed rate) temperature region at a temperature equal to 1050° C. or higher in which a normal silicon epitaxial growth is effected, when a difference in growth temperature is equal to or less than 7° C., growth temperature is not substantially changed and uniform growth speed can even locally be realized.

Returning to FIG. 11 which has been described above while keeping in mind that no change in local growth speed is achieved in a difference in growth temperature equal to or less than 7° C., the central region C and the region D comprising three locations in the peripheral portion are found to be areas in which temperatures are relatively low. The regions C and D respectively correspond to contact positions of the vertical pin 27c and lift pins 28.

While the region C corresponds to a position at which the vertical pin 27c is put in contact with the susceptor from under, since heat of the infrared lamps 29b is hard to reach by spatial shielding caused by the rotary shaft 26, it is believed that decrease in temperature occurs for this reason.

While the region D corresponds to positions at which the lift pins 28 are put in contact with the wafer from under, since a thermal conductivity of a graphite base material which is a structural material of the lift pins 28 is very high, heat dissipation through the lift pins 28 as thermal conduction routes is effected, which, it is believed, causes decrease in temperature.

The insular region B is areas with a little higher temperature than the peripheral area of each and corresponds to positions in which the spokes 27 extending in three direction from the central shaft 26 are arranged. It is believed that since quartz which is a structural material of the spokes 27 exerts large heat accumulating effect due to its low thermal conductivity, temperature of areas in the vicinity are raised when they are heated.

The invention is to realize a uniform temperature distribution in the surface of a silicon wafer by contriving a shape of support means which has a possibility to affect a temperature distribution in the surface of the silicon wafer.

As one of the contrivances, while a distance between the outer peripheral edge of a susceptor and a position at which the far end of each of the support members is put in contact with the susceptor is decreased compared with the prior art, that is the position at which the far end of each support member is put in contact with the susceptor is moved away from the periphery of a silicon wafer, the optimal value of the distance cannot dimensionally be determined as a definite value, since the optimal value of the distance is varied according to a diameter, thickness and thermal conductivity of a susceptor, an output of heating means, a shape and size of the far end of each support member and the like. In the invention, that the distance is determined in terms of temperature in such a manner that "decrease in temperature of the wafer peripheral portion from the maximum temperature in the silicon wafer which is disposed on a susceptor is suppressed to be equal to or lower than 7° C." for the purpose to generalize the definition of the distance.

EXAMPLE 1

A silicon epitaxial wafer of the invention will be described with reference to FIG. 2 in the example. Pitches of hatching expressing surface roughness of FIG. 2 is smaller than those in the case of FIG. 11 which has been described and magnitudes of surface roughness expressed by hatching with different pitches are different from one another, though there is no difference in that both are expressed by hatching.

The silicon epitaxial wafer EW is obtained by growing a p-type silicon epitaxial layer (a resistivity=10 Ω·cm) to a target thickness 15 $\mu$m on a $p^+$ type silicon single crystal silicon wafer with a diameter of 200 mm and a main surface of a (100) plane.

Figure 11:
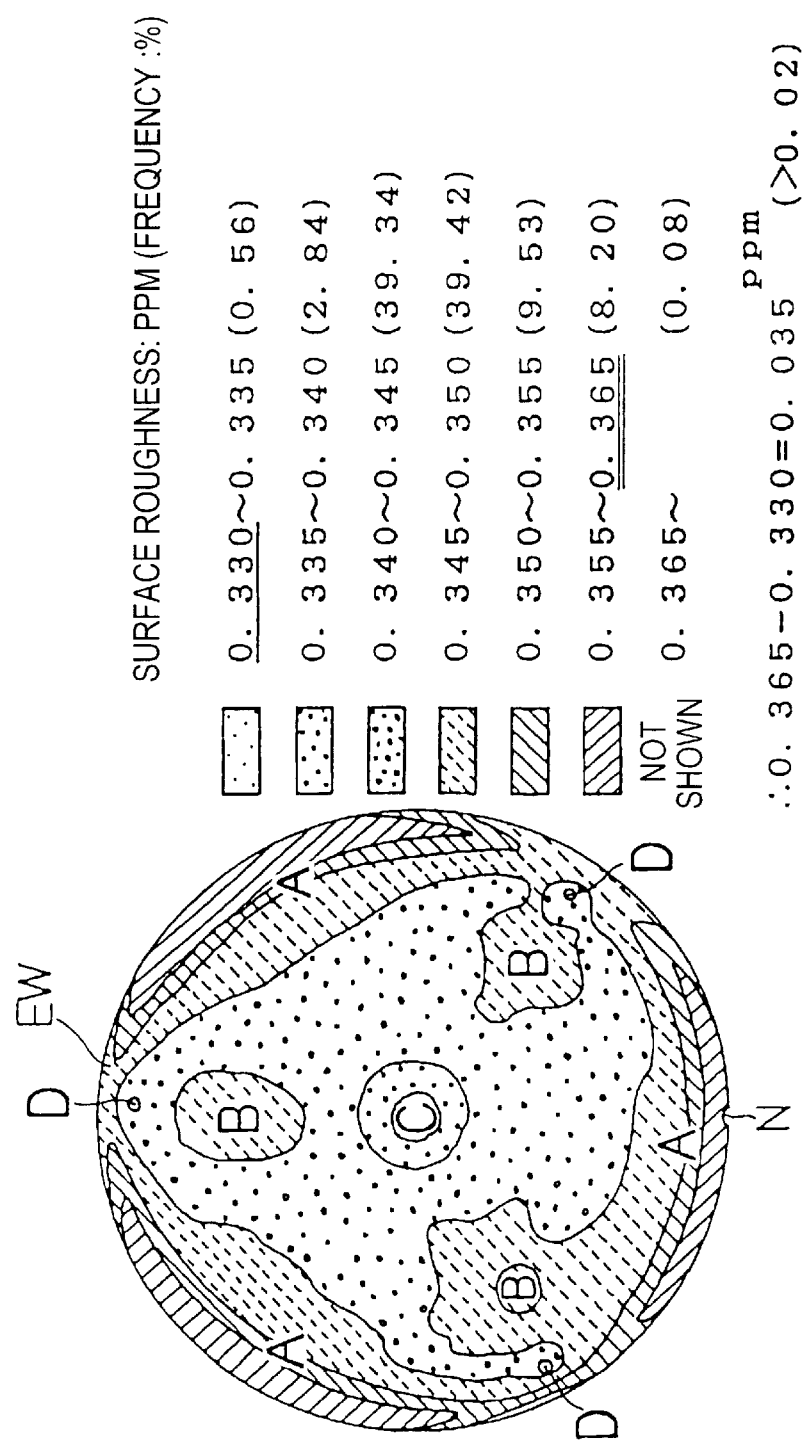
FIG. 11 is a chart showing a surface roughness distribution of a silicon epitaxial layer of a conventional silicon epitaxial wafer.

While in FIG. 2 showing the invention, there can be observed the regions A to C which is similar to FIG. 11 showing a conventional example, how the regions appear on a wafer is considerably different from each other. First, the region A which is surface roughness increased areas which appear at three sites of the peripheral portion of the silicon epitaxial wafer EW of FIG. 2 is considerably contracted compared with FIG. 11 showing a conventional example. The region B which is also surface roughness increased areas appearing in insular shapes is not isolated and more uniformly distributed in the surface of the silicon wafer. Further, the region C, which is in the central area, is not a clear-cut circular surface roughness decreased area as shown in FIG. 11 but a surface roughness increased area in the sense of ambiguity. The dot like region D which is observed in FIG. 11 does not appear in FIG. 1.

In the invention, a surface roughness distribution in a surface is calculated based on all measurements of surface roughness in the surface by a laser scattered light detection method excluding measurements of surface roughness in the surface by the laser scattered light detection method which are respectively included within a cumulative frequency of 0.3% in the upper and lower ends of all the measurements. In the case of the silicon epitaxial wafer EW shown in FIG. 1, the measurements included within the cumulative frequency of 0.3% in the upper and lower ends are regions equal to or less than surface roughness of 0.334 ppm (a frequency 0.08%) and equal to or more than surface roughness of 0.352 ppm (a frequency 0.15%). Accordingly, the maximum of surface roughness in the surface of the silicon epitaxial wafer is 0.352 ppm and the minimum is 0.334 ppm and a surface roughness distribution in the surface spans 0.018 ppm from 0.352 ppm to 0.334. The value is within a value of 0.02 ppm defined by the invention and the silicon epitaxial wafer was confirmed to have a very uniform surface roughness distribution in the surface.

Figure 3C:
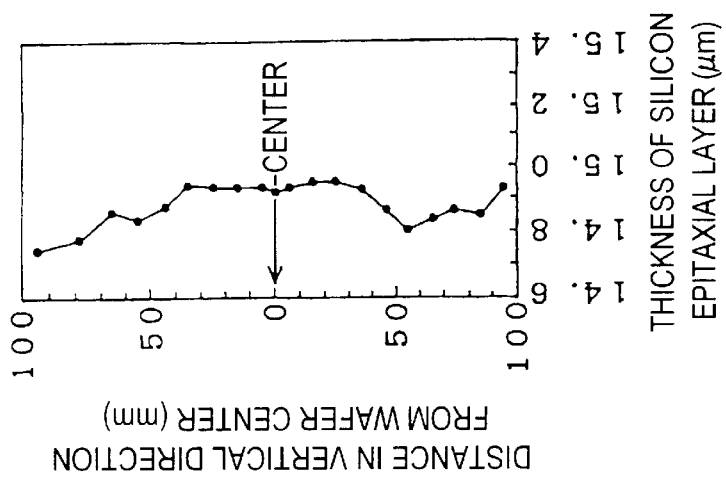
FIG. 3B shows a film thickness distribution along a lateral diameter of the wafer and FIG. 3C shows a film thickness distribution along a vertical diameter of the wafer.
Figure 3A:
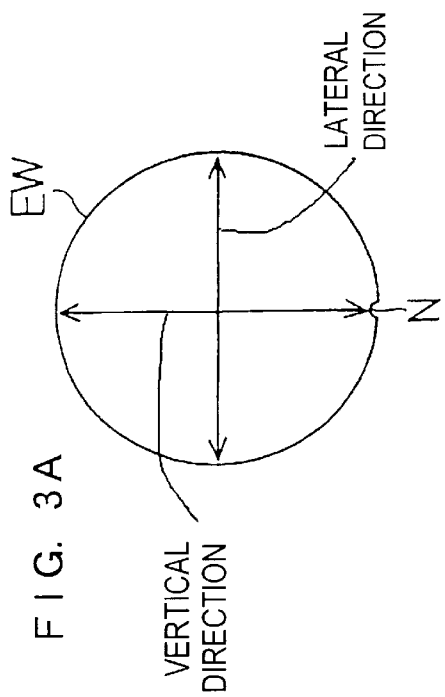
FIGS. 3A, B and C are an illustration and graphs showing a film thickness distribution of a silicon epitaxial layer of a silicon epitaxial wafer of the invention.
Figure 3B:
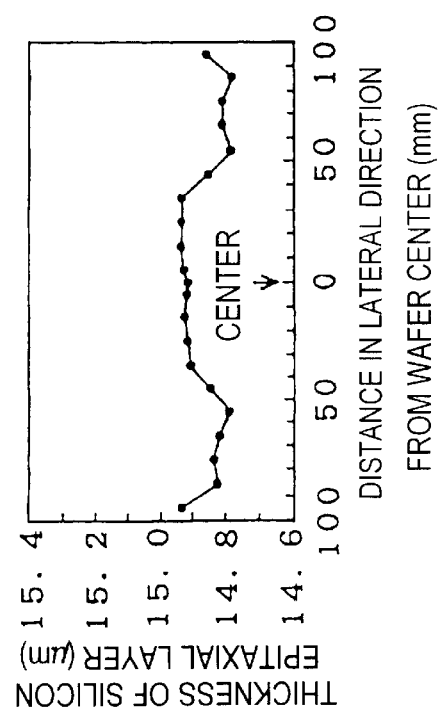

A film thickness distribution of a silicon epitaxial wafer EW of the invention is further shown in FIGS. 3A to C. FIG. 3A shows measurement directions for a film thickness distribution and a direction facing to the notch N indicating a crystallographic orientation is a vertical direction, while a direction intersecting the vertical direction at a right angle is a lateral direction. FIG. 3B shows a film thickness distribution vs. a distance from the center of the silicon epitaxial wafer EW along the lateral direction, while FIG. 3C shows a film thickness distribution vs. a distance from the center of the silicon epitaxial wafer EW along the vertical direction.

As is clear from these figures, there appear almost no decreases in thickness of the silicon epitaxial wafer in the center of the wafer. Further, the SFQD of the definition according to SEMI are 0.01 $\mu$m at the wafer center and the maximum value is 0.17 $\mu$m across the entire wafer, which are improved by a great margin compared with conventional.

In production of a silicon epitaxial wafer, a flatness related failure rate in terms of SFQD can be improved to a value equal to or less than 0.7% by suppressing a surface roughness distribution in the surface of a silicon epitaxial layer within a value equal to or less than 0.02 ppm defined in the invention.

That is, a silicon epitaxial wafer in which surface roughness of the silicon epitaxial layer is suppressed to a value equal to or less than 0.02 ppm defined in the invention does not raise any change in film thickness and any change in flatness locally which are caused by a local change in temperature.

EXAMPLE 2

Figure 4:
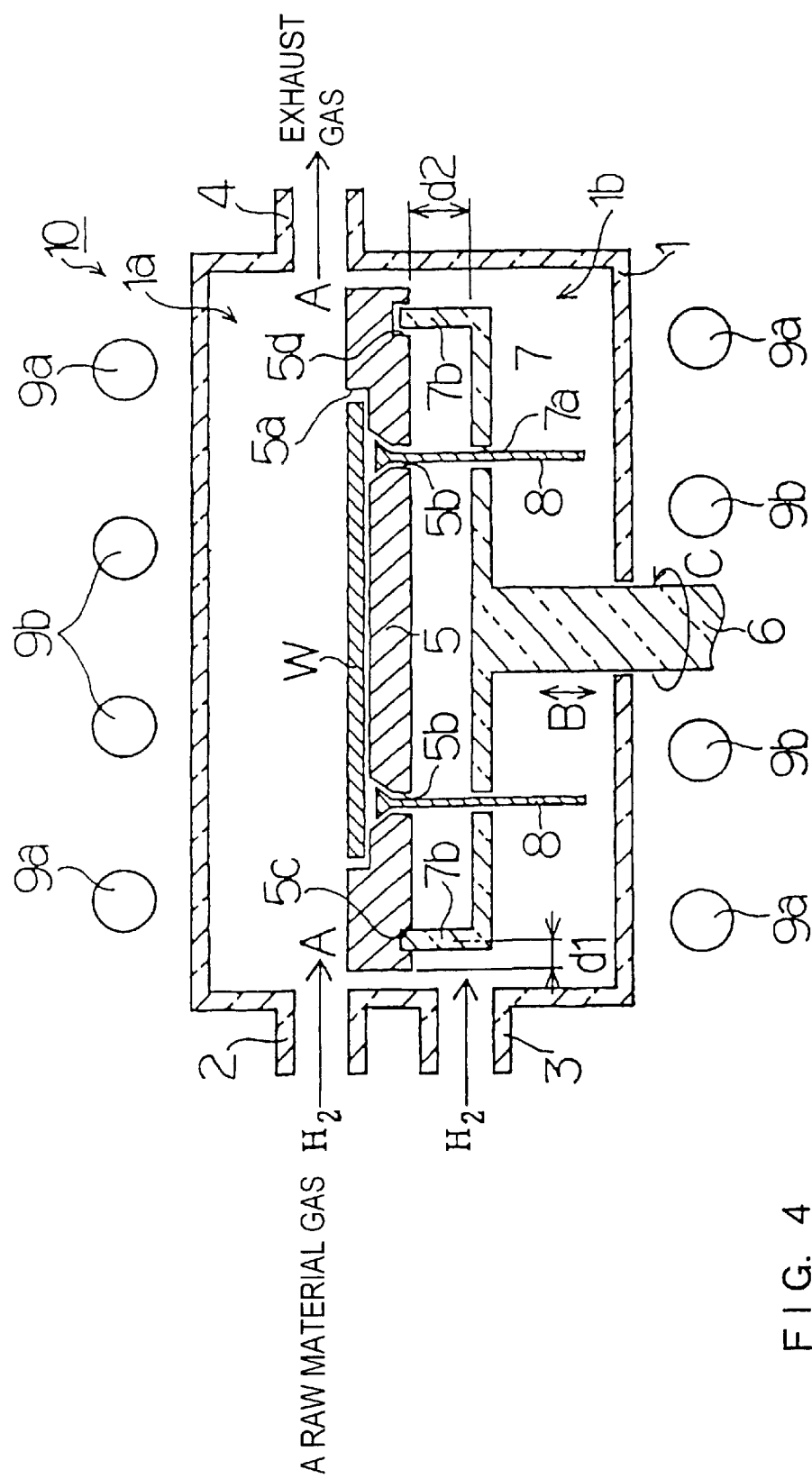
FIG. 4 is a schematic sectional view showing a structure, as an example, of a vapor phase thin film growth apparatus which can be used in the invention.
Figure 5:
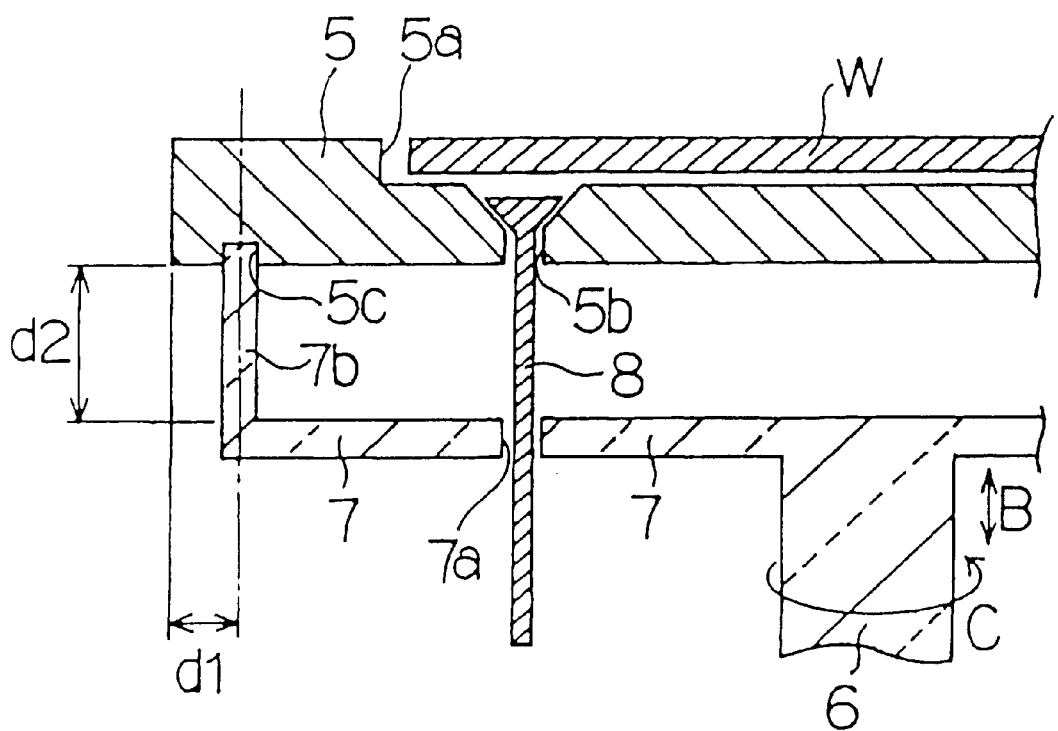
FIG. 5 is a schematic, enlarged, sectional view showing a part of the vapor phase thin film growth apparatus of FIG. 4.
Figure 6:
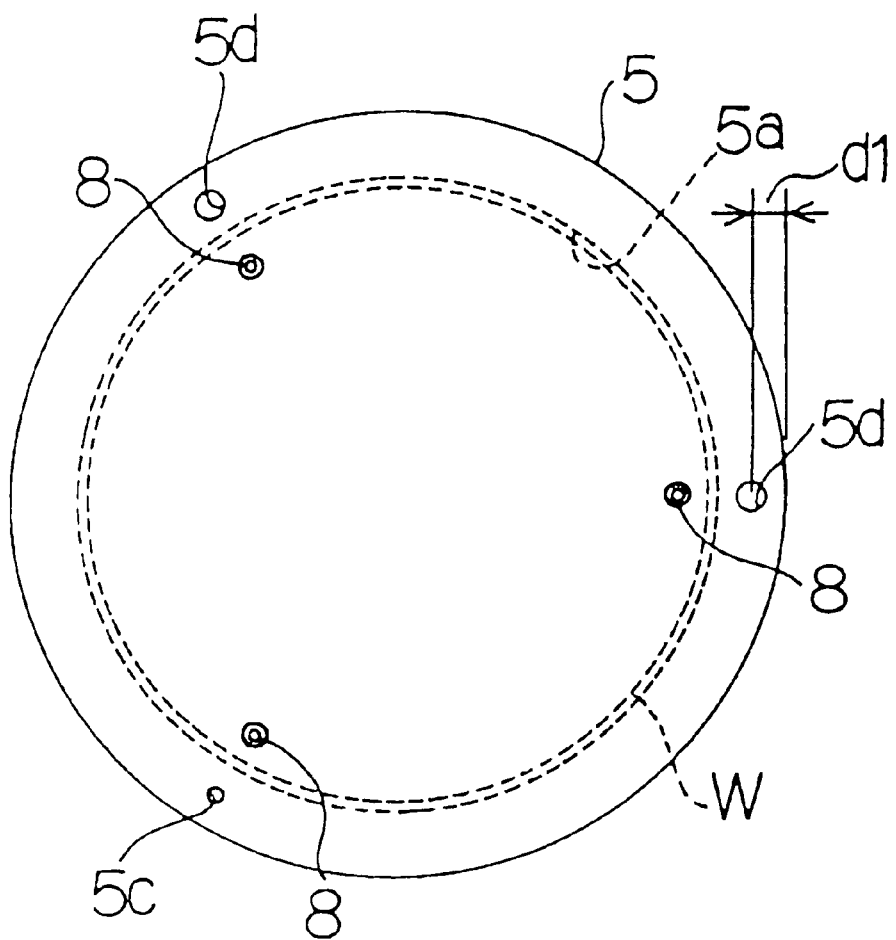
FIG. 6 is a plan view as seen from the rear surface of a susceptor of the vapor phase thin film growth apparatus of FIG. 4.

A structure as an example of a single wafer type vapor phase thin film growth apparatus 10 which was used in production of the silicon epitaxial wafer which is shown in Example 1 will be described with reference to FIGS. 4 to 6. FIG. 4 is a schematic sectional view showing a structure as an example of a vapor phase thin film growth apparatus, FIG. 5 is a schematic, enlarged, sectional view showing a part of the vapor phase thin film growth apparatus of FIG. 4 and FIG. 6 is a plan view as seen from the rear surface of a susceptor thereof.

In the apparatus, a silicon wafer W is set one at a time in a process vessel 1 made of transparent quartz and the silicon wafer W is heated using infrared lamps 9a, 9b from above and under and vapor phase epitaxial growth is conducted while the heating.

The interior of the process vessel 1 is partitioned into an upper space 1a and a lower space 1b by a susceptor 5 on which the wafer W is disposed.

The susceptor 5 is a disk having a diameter of 250 mm and a thickness of 4 mm, made of a graphite base material coated with SiC by CVD coating and a pocket 5a for placement of the silicon wafer therein is formed on the upper surface thereof. A size of the pocket 5a is, for example, when an 8 inch wafer (a diameter 200 mm) is placed, a diameter of 205 mm and a depth of 1 mm.

Further, a recess 5c having a diameter of 4 mm and a depth of 2 mm and a recess 5d having a diameter of 10 mm and a depth of 2 mm are respectively formed, as shown in FIG. 6, in the peripheral portion of the rear surface of the susceptor 5 at positions at each of which the head of a vertical pin 7b provided at the far end of a support member, that is the far end of a spoke 7, described later, is put in contact with the susceptor 5. In this case, since there are three spokes 7, the recesses 5c, 5d are respectively arranged at equal angular intervals of 120 degrees about the center. At this point, it is considered that the centers of the recesses 5c, 5d and the centers of the vertical pins 7b respectively coincide with each other and a distance from the outer peripheral edge of the susceptor 5 to the centers of the recesses 5c, 5d is defined as an outer peripheral edge to vertical pin distance d1. In this case, d1=5 mm as an example. The vertical pin positions are shifted further to the outside each by 6 mm compared with conventional.

Figure 8:
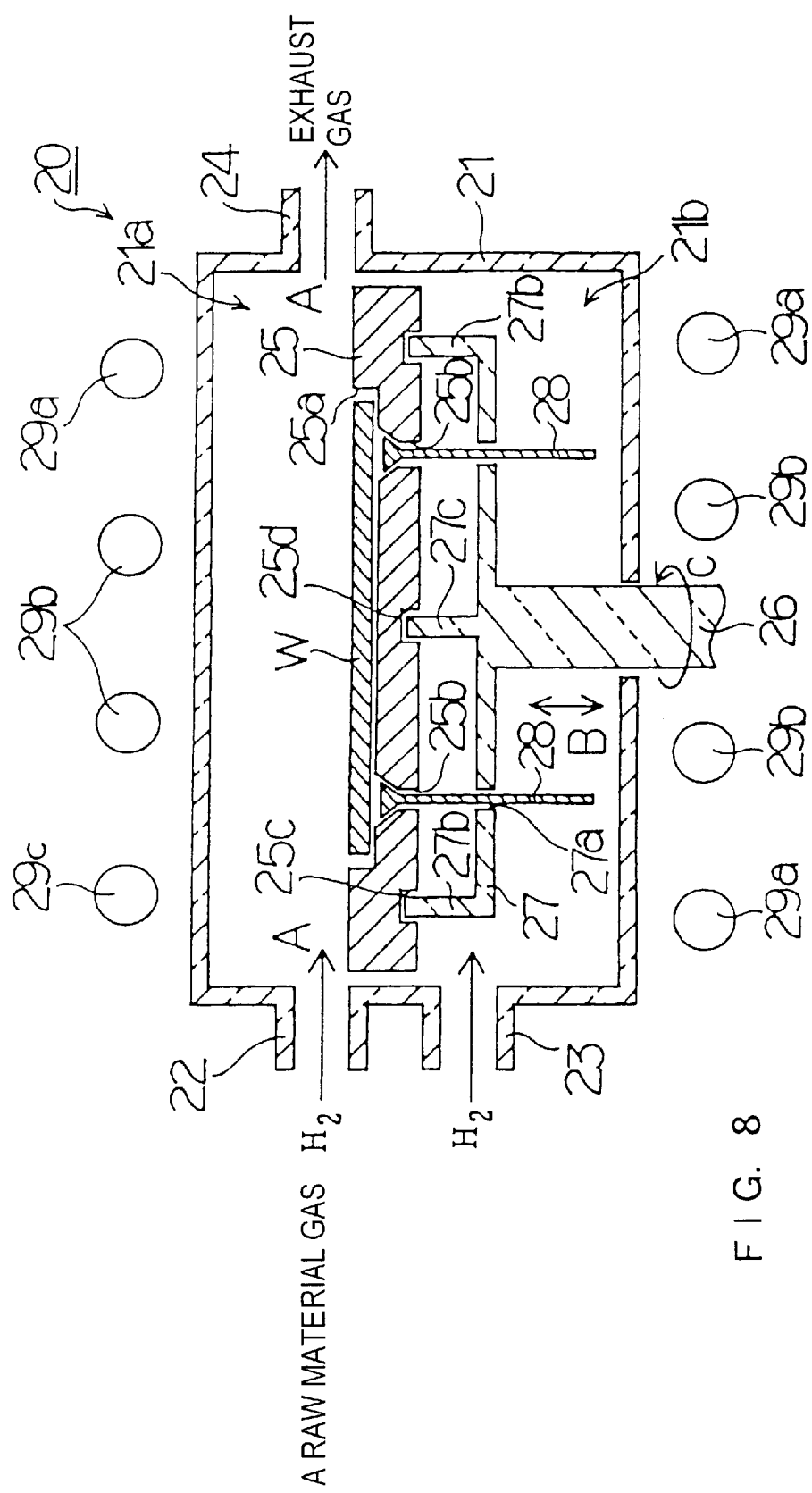
FIG. 8 is a schematic sectional view showing a structure, as a typical example, of a conventional vapor phase thin film growth apparatus during use in vapor phase growth.
Figure 9:
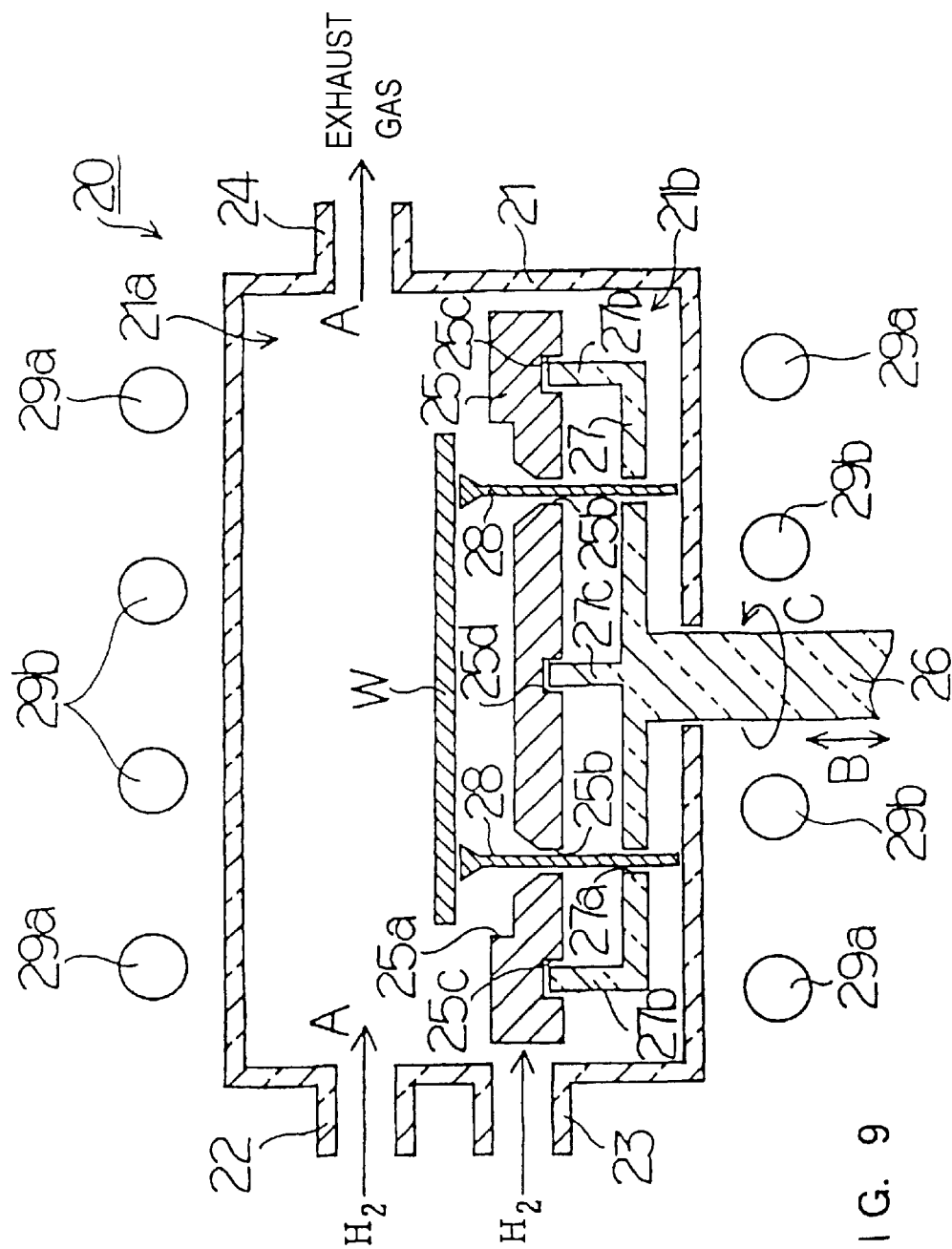
FIG. 9 is a schematic sectional view showing a structure, as a typical example, of a conventional vapor phase thin film growth apparatus when a silicon wafer is moved upward from a susceptor using lift pins.

In the mean time, in a conventional apparatus as shown in FIG. 8 which is described above, a vertical pin 27c is provided on the prolongation of a rotary shaft 26 and positional matching between a susceptor 25 and support members has been performed using a recess 25d on the rear surface of the susceptor at the central portion thereof for receiving the vertical pin 27c.

However, since such positional matching cannot be adopted in the invention in which the vertical pin in the central portion is omitted, one of the recesses in the peripheral portion is used for the positional matching instead. The reason why a recess 5c is smaller than the other two in diameter is for use in the positional matching. That is, the recess 5c having a diameter in which the vertical pin 7b can be accommodated without any gap is used for positional matching and the other two recesses 5b have some margins.

In the upper space 1a of the process vessel 1, a raw material gas introduced through a gas supply port 2 together with a carrier gas $H_2$ flow along the surface of a silicon wafer W in a direction of an arrow A in the figure while forming almost a laminar flow and discharged from an exhaust port 4 on the other side.

Purge gas, $H_2$ gas as purge gas under higher pressure than that of the above mentioned raw material gas is supplied to the lower space 1b. The reason why the purge gas is under high pressure is that the raw material gas is prevented from intruding into the lower space 1b through a gap between the process vessel 1 and the susceptor 5.

Support means made of quartz for supporting the susceptor 5 by the rear surface thereof and lift pins 8 for loading and unloading of the silicon wafer W on the susceptor 5 are included in the lower space 1b.

The support means is constructed from a rotary shaft 6 and, for example, three spokes 7 branched at and extending radially from the rotary shaft 6. Vertical pins 7b are provided at the respective far ends of spokes 7 and the fore ends of the vertical pins 7b are inserted in an engaged manner in the recesses 5c, 5d formed on the rear surface of the susceptor 5 for supporting the susceptor 5. In an apparatus of the invention, there is no member corresponding to a vertical pin being put in contact with the rear surface of the susceptor 5 at the center thereof on the prolongation of the rotary shaft, as in a conventional apparatus. A distance between the rear surface of the susceptor 5 and the spokes 7 is defined as a susceptor spoke distance d2. In this case, it was set that d2=15 mm.

The rotary shaft 6 is rotatable in a direction of an arrow C by drive means, not shown, in the figure.

The head of each of the lift pins 8 is enlarged in diameter and is rested while hanging on a tapered side wall of a through-hole 5b formed in the bottom surface of a pocket 5a of the susceptor 5 for disposing a silicon wafer W. The shaft portion of each lift pin 8 is inserted through a through-hole 7a which is formed by boring the middle portion between both ends of a spoke 7 and each lift pin 8 is designed to be vertically hung down in a stable manner.

As a material making the lift pins 8 in the example, a SiC base material coated with SiC is employed. The SiC base material is low in thermal conductivity compared with a conventional graphite base material.

A silicon wafer W is loaded on and unloaded from the susceptor 5 by vertical movement of the support means. For example, when the silicon wafer W is unloaded from the susceptor 5, the support means is moved downward and the tail ends of the lift pins 8 are directly put into contact with the inner surface of the lower space 1b of the process vessel 1. With such encouraged conditions, the lift pins 8 push up the rear surface of the silicon wafer W with the heads, thereby floating the silicon wafer W upward from the pocket 5a. Thereafter, a handler, not shown, is inserted into a space between the susceptor 5 and the silicon wafer W and the silicon wafer W is handed over or received and further transported.

The plurality of infrared lamps 9a, 9b are arranged in two concentric circles. The infrared lamps 9a constitute one outside group of infrared lamps and the infrared lamps 9b constitute the other inside group of infrared lamps and spatial, central axes of the groups are aligned with the rotary shaft 6 of the susceptor 5. Currents supplied for the two groups of infrared lamps 9a, 9b can independently be controlled in amount and heat supplied from the groups can accordingly be controlled in an independent manner from each other.

Actual vapor phase growth of a silicon epitaxial layer was performed using the above mentioned vapor phase thin film growth apparatus.

A $p^+$ silicon single crystal substrate with a diameter of 200 mm and a main surface of a (100) plane was used and a p type silicon epitaxial layer of a resistivity of 10 Ω·cm was grown on the substrate to a target thickness of 15 μm.

Epitaxial growth conditions were as follows as an example:

$H_2$ annealing: 1130° C. and 45 seconds

Epitaxial growth temperature: 1130° C.

$H_2$ flow rate: 40 l/min

Raw material gas ($SiHCl_3$ is diluted with $H_2$) flow rate: 12 l/min

Dopant ($B_2H_6$ is diluted with $H_2$) flow rate: 100 ml/min

A temperature distribution of the silicon single crystal substrate is optimized so that a surface roughness distribution in the surface of a silicon epitaxial layer is suppressed to a value equal to or less than 0.02 ppm adopting the above described conditions in growth of the silicon epitaxial layer. Further, a supply rate of the raw material gas is controlled to adjust a film thickness distribution in the surface of the wafer.

The silicon epitaxial wafer which is described in Example 1 was obtained in such a way. A surface roughness distribution of the silicon epitaxial wafer EW is 0.018 ppm and it is understood from the magnitude of a surface roughness distribution thus obtained that the contrivance of structure of an apparatus for suppressing a difference in temperature between the maximum and the minimum in the surface of the silicon wafer to a value equal to or less than 7° C. is effective.

That decrease in surface roughness, that is decrease in temperature, in the region C of the wafer central area, is resulted from a technique in which a vertical pin which is put into contact with the rear surface of the susceptor at the center thereof is omitted and further an output of the inside infrared lamps 9b is set to be large compared with that of the outside infrared lamps 9a. The reason why the region A is relatively contracted is that a contact position with the susceptor 5 of a vertical pin 7b at the far end of each of the spokes 7 is moved to the outside compared with the prior art. Further the reason why the region B comes to be unclear is that a susceptor spoke distance d2 is enlarged compared with conventional.

The reason why the region D disappears is that as a material of a lift pin 8, a SiC base material with a low thermal conductivity compared with a graphite base material used conventionally is adopted.

Figure 7:
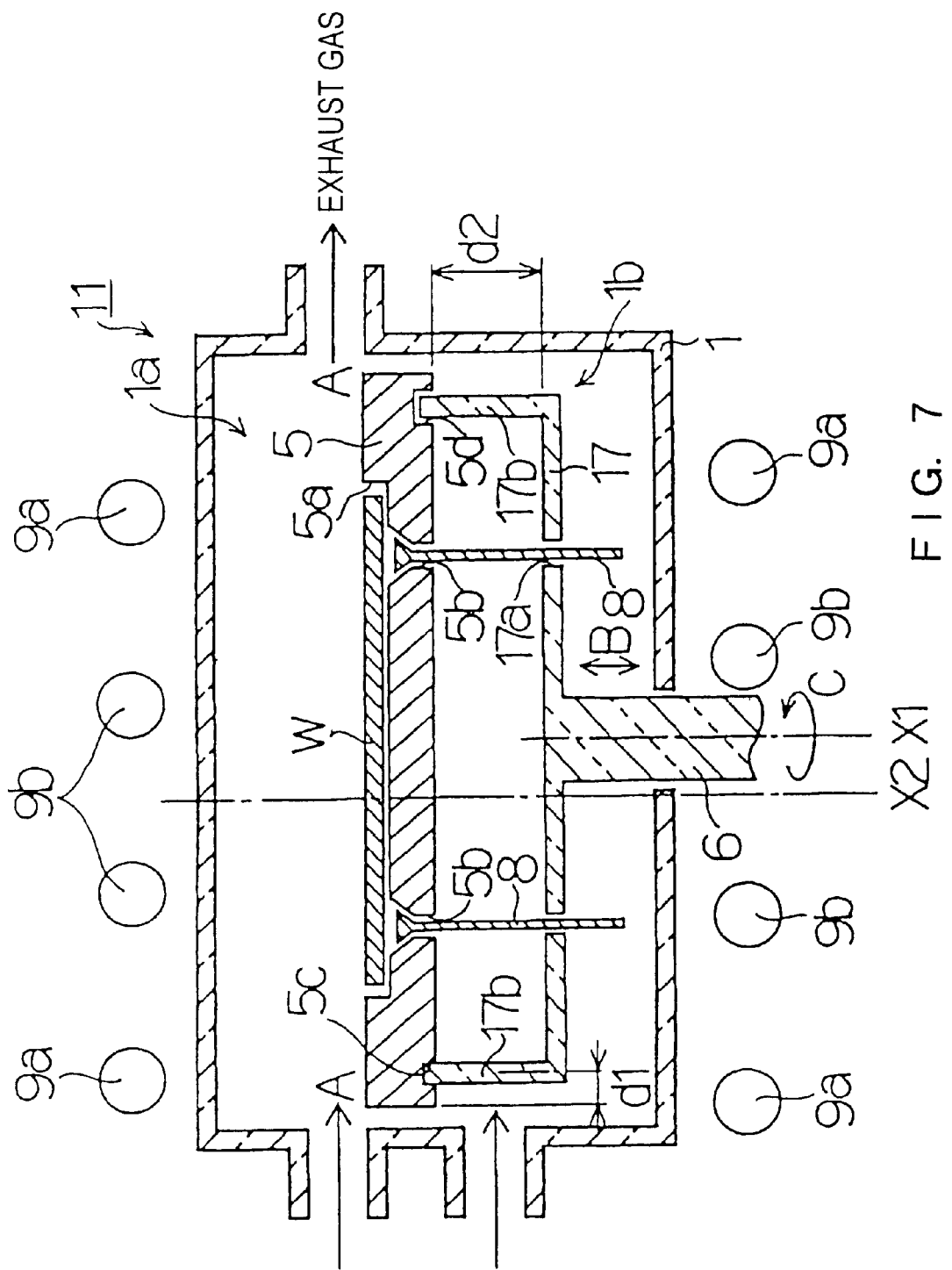
FIG. 7 is a schematic sectional view showing an example with an increased distance between the susceptor and spokes of the vapor phase thin film growth apparatus of FIG. 4.

In the mean time, it is effective that, in the apparatus, a susceptor spoke distance d2 is larger and that the central axis of the infrared lamp assembly is eccentrically shifted from the rotary shaft 6 of the susceptor. An example in structure of such a vapor phase thin film growth apparatus is shown in FIG. 7.

A fundamental structure of the vapor phase thin film growth apparatus 11 shown in the figure is almost the same as that of the vapor phase thin film growth apparatus 10 of FIG. 4 which is described above but a susceptor spoke distance d2 is set to be larger than d1.

Further, the axial line X1 of the rotary shaft 6 and the central axis X2 of the assembly of the infrared lamps 9a, 9b are not aligned with each other.

With such a structure, a surface roughness distribution in the surface of a silicon epitaxial wafer can be more uniform.

According to a production method of the invention, since vapor phase growth can be effected in the range of a temperature difference at which a practically uniform growth speed is secured even locally, a silicon epitaxial wafer with neither a local change in film thickness nor a local change in flatness caused by a local change in temperature can be produced.

In other words, since a film thickness dispersion in the surface of a wafer which arises according to a production method of the invention is substantially caused only by a supply distribution on the surface of a raw material gas, a silicon epitaxial wafer with more of uniformity in film thickness can be produced by properly controlling a supply rate of the raw material gas after a temperature distribution of a silicon wafer is optimally adjusted so that a surface roughness distribution in the surface of the silicon epitaxial layer is suppressed to be equal to or less than 0.02 ppm.

Figure 10A:
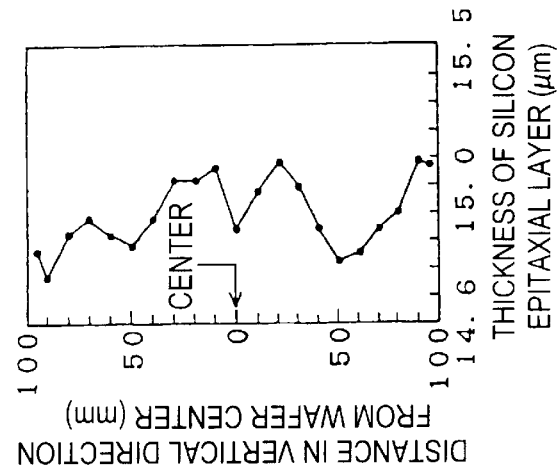
FIGS. 10A, B and C are an illustration and graphs showing a film thickness distribution of a silicon epitaxial layer of a conventional silicon epitaxial wafer of the invention.
Figure 10B:
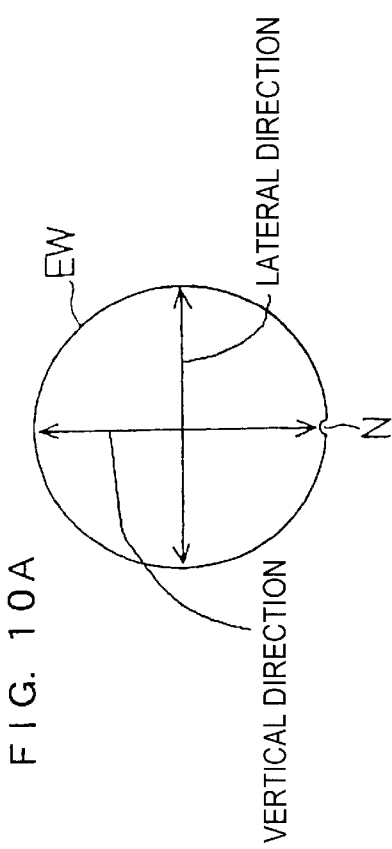
FIG. 10B shows a film thickness distribution along a lateral diameter of the wafer and FIG. 10C shows a film thickness distribution along a vertical diameter of the wafer.
Figure 10C:
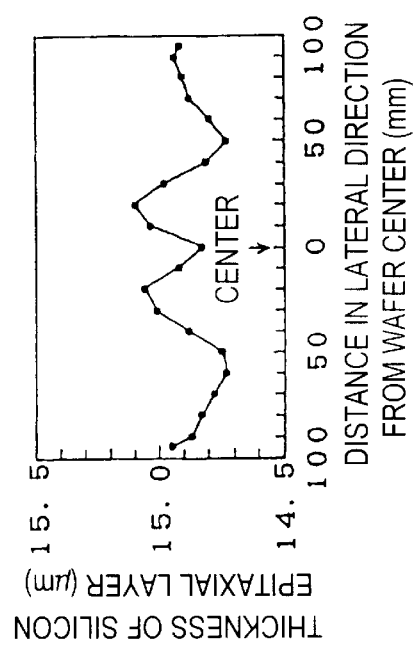

For example, a film thickness distribution which had been amounted to about 0.4 μm in the surface of a wafer in FIG. 10, described above, showing a conventional silicon epitaxial wafer EW was improved to about 0.2 μm, a half of the prior art, as shown in FIG. 3 according to a production method of the invention.

While embodiments of the invention are described above, the invention is not limited to the descriptions in the embodiments. For example, shapes of support means and lift means, the number of spokes branched at the top end of a rotary shaft, a diameter of a silicon wafer in use, conditions for silicon epitaxial growth, details of the structure of a vapor phase thin film growth apparatus and the like can be subjected to a change, selection or combination in a proper manner.

What is claimed is:

1. A production method for a silicon epitaxial wafer in which a silicon wafer is grown while disposed on a rotary susceptor horizontally supported in a process vessel and a silicon epitaxial layer is grown in a vapor phase on the silicon wafer while heating the silicon wafer, characterized by that a temperature distribution of the silicon wafer during growth is optimized so that a surface roughness distribution in a surface of the silicon epitaxial layer, which is calculated based on all measurements of surface roughness in the surface thereof by a laser scattered light detection method excluding measured values which are respectively included within a cumulative frequency of 0.3% in the upper and lower end sides of all the measurements, is suppressed to be equal to or less than 0.02 ppm.

2. A production method for a silicon epitaxial wafer according to claim 1, wherein support of the susceptor is effected by putting a far end of each of a plurality of support members radially branched from a top end of a vertical rotary shaft in contact with a peripheral portion of a rear surface of the susceptor surrounding an area in which the silicon wafer is disposed and setting a distance from an outer periphery of the susceptor to the far end of each of the plurality of support members to a value at which decrease in temperature of an outer peripheral portion of the silicon wafer from the maximum in the surface of the silicon wafer disposed on the susceptor is suppressed to a value equal to or lower than 7° C.

3. A production method for a silicon epitaxial wafer according to claim 2, wherein heating of the silicon wafer is performed using a plurality of infrared lamps arranged so that the plurality of infrared lamps assume respective positions around an central axis disposed eccentric to an axis of rotation of the susceptor in axial symmetry with respect to the central axis.

4. A production method for a silicon epitaxial wafer according to claim 1, wherein a distance between a rear surface of the susceptor and each of the plurality of support members is set to a value at which decrease in temperature of an outer peripheral portion of the silicon wafer from the maximum in the surface of the silicon wafer disposed on the susceptor is suppressed to a value equal to or less than 7° C.

5. A production method for a silicon epitaxial wafer according to claim 4, wherein heating of the silicon wafer is performed using a plurality of infrared lamps arranged so that the plurality of infrared lamps assume respective positions around an central axis disposed eccentric to an axis of rotation of the susceptor in axial symmetry with respect to the central axis.

6. A production method for a silicon epitaxial wafer according to claim 1, wherein a film thickness distribution in a surface of the silicon epitaxial layer is adjusted after a temperature distribution in a surface of the silicon wafer is optimized.

7. A production method for a silicon epitaxial wafer according to claim 1, wherein one of a plurality of contact positions between a peripheral portion of a rear surface of the susceptor and support members is used for positional matching for the susceptor.

8. A production method for a silicon epitaxial wafer according to claim 1, wherein vapor phase growth of a silicon epitaxial layer on the silicon wafer is effected in a single wafer mode.

* * * * *